United States Patent

[11] 3,634,856

[72] Inventor Stig Erik Karlsson
Skarholmen, Sweden
[21] Appl. No. 866,451
[22] Filed Oct. 15, 1969
[45] Patented Jan. 11, 1972
[73] Assignee Telefonaktiebolaget LM Erricsson
Stockholm, Sweden
[32] Priority Oct. 29, 1968
[33] Sweden
[31] 14601/68

[54] ANALOG TO DIGITAL ENCODER
1 Claim, 3 Drawing Figs.

[52] U.S. Cl. .... 340/347 AD, 324/99
[51] Int. Cl. .... H03k 13/04
[50] Field of Search .... 340/347; 324/98, 99

[56] References Cited

UNITED STATES PATENTS

| | | | |
|---|---|---|---|
| 3,242,348 | 3/1966 | Sem-Sandberg et al. .... | 340/347 X |
| 3,309,693 | 3/1967 | Davis .... | 340/347 |

*Primary Examiner*—Maynard R. Wilbur
*Assistant Examiner*—Charles D. Miller
*Attorney*—Hane & Baxley

ABSTRACT: An analog to digital encoder obtains the binary digits from successive comparisons between the analog signal and reference signals obtained from different combinations of a number of reference signal sources activated by means of setting appertaining flip-flops. The setting of the desired flip-flops is controlled by logical circuits interconnecting the flip-flops. By means of these logical circuits the shift register normally required in this type of coder can be eliminated.

INVENTOR
STIG ERIK KARLSSON
BY Hane and Baxley
ATTORNEYS

INVENTOR
STIG ERIK KARLSSON
BY Hane and Baxley
ATTORNEYS

ANALOG TO DIGITAL ENCODER

The present invention refers to an analog to digital encoder comprising a discriminator whose output constitutes the output of the encoder wherein, a binary 1 or 0 is obtained at the output dependent on whether the amplitude of the signal supplied to a first input is smaller or larger than the amplitude of a signal supplied to a second input of the discriminator. The first input is the input of the arrangement for receiving the analog signal to be coded and a second input of the discriminator connected, via an adding circuit to a number of bistable flip-flops each of which controls an appertaining reference signal source. Each source generates a signal having an amplitude twice as large as the previous one and each flip-flop is provided with a set and a reset input, the appertaining reference signal source being switched in or out in dependence on the state of the flip-flop.

When coding analog signal into binary digits, the digits are generated by successive comparison in dependence on whether the reference signal used at the previous comparison has been found smaller or larger than the analog signal. For generating the different reference signals generally a number of signal sources having different reference signals generally a number of signal sources having different signal amplitudes are used. The comparison is made between the analog signal and a signal consisting of the sum of the signals from a number of switched in sources. The successive switching in of different combinations of signal sources is controlled from successively activated outputs of a shift register which is shifted by a clock pulse generator. Each output of the shift register is, via a logic network, connected to a number of flip-flops, the setting of which implies a switching in of the desired reference signal sources, the logic network also having an input to which the result of the previous comparison is supplied. The shift register generally consists of bistable digits to be generated in the encoder and thus the shift register constitutes an expensive part of toe coder. An object of the present invention is to provide an encoder in which desired reference signal sources are switched in and out without using a shift register. The characteristics of the invention will appear from the appended claim.

The invention will be described in more detail with reference to the accompanying drawing, in which.

Figure 1:
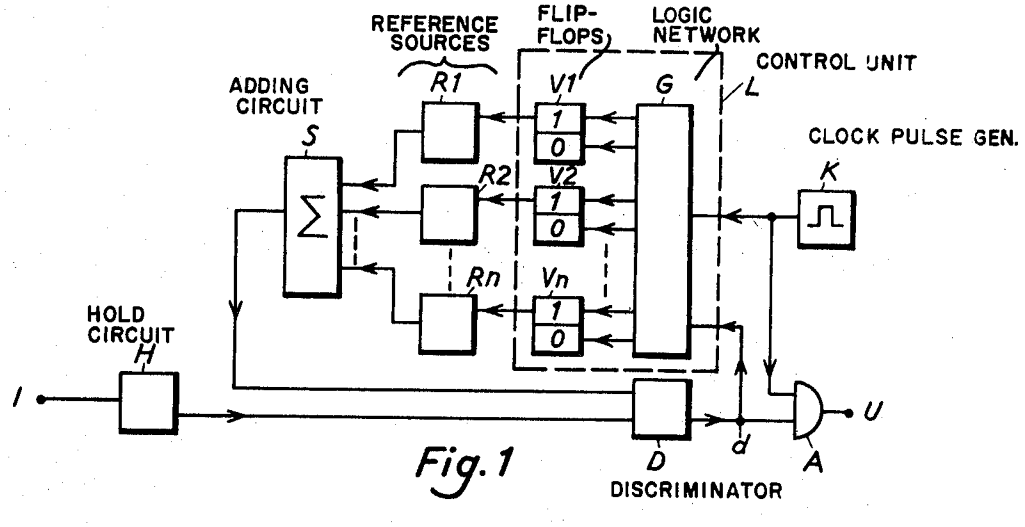
FIG. 1 shows a block diagram of an encoder.

In FIG. 1 reference I denotes the input of an encoder to which a sample of an analog signal is supplied periodically. The amplitude value of the analog signal is obtained in a hold circuit H, at the output of which the value is maintained during the time required for the encoding of the signal. The output of the hold circuit H is connected to one input of a discriminator D, the other input of which is connected to a number of reference signal sources R1, R2...R*n* via an adding circuit S. The discriminator has the property that a binary 1 is obtained at its output *d* if the signal at the first input exceeds the signal at the second input, whereas otherwise a 0 is obtained. The output of the discriminator is connected to one input of an AND-circuit A, the output of which constitutes the output U of the arrangement, the other input of the AND-circuit being connected to a clock pulse generator K. The clock pulse generator K as well as the discriminator D are also connected to a control unit L, including bistable flip-flops V1, V2...V*n*; each flip-flop appertaining to a reference signal source, and further a logic network G via which the flip-flops are controlled. The logic network generally consists of a shift register which is shifted by the clock pulses and which via logical circuits, sets and resets the flip-flops in order to switch in the desired combinations of signal sources. The pattern according to which the signal sources are switched in will be explained in connection with FIG. 2.

Figure 2:
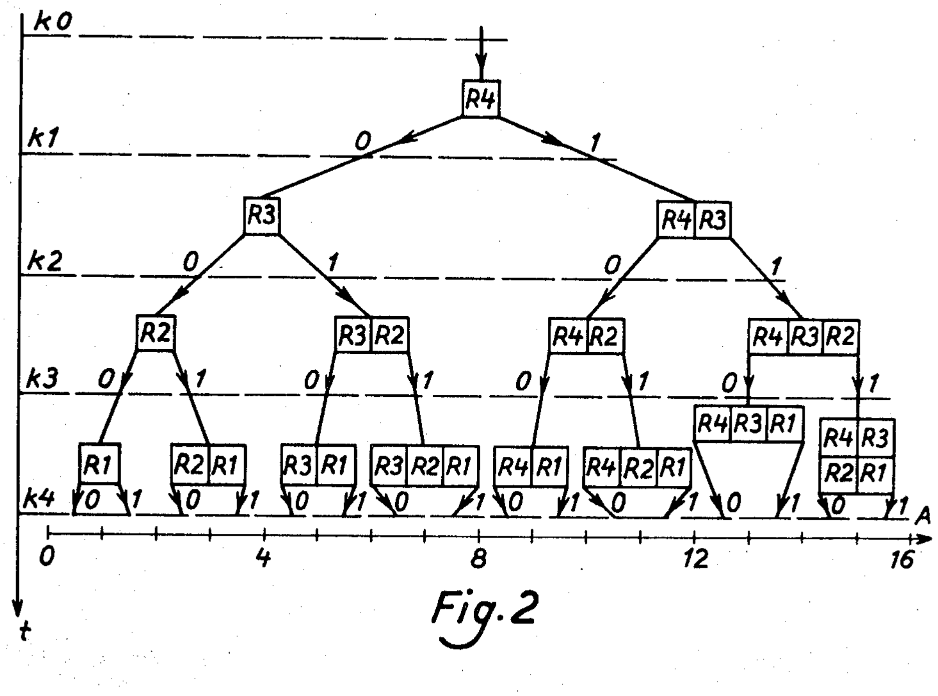
FIG. 2 shows a diagram of those different reference signal sources of the encoder in FIG. 1 which are switched in at different amplitude values of the analog signal to be encoded and FIG. 3 shows a block diagram of how the flip-flops in FIG. 1 are interconnected according to the invention.

In FIG. 2 the amplitude range within which the amplitude of the analog signal falls is indicated at the abscissa. This range is divided into 16 equally wide parts each of which is to be represented by 4 binary digits. These digits can be generated from successive comparisons between the analog signal and reference signals obtained from four different signal sources R1, R2, R3 and R4 (FIG. 1). The reference signal source R4 then generates a signal having the amplitude 8, the source R3 a signal having the amplitude 4, the source R2 a signal having the amplitude 2 and the source R1 a signal having the amplitude 1. The conditions for switching in the signal sources appear from the figure, where five successive clock pulses *k*0–*k*4 from the clock pulse generator are indicated at the ordinate. The clock pulse *k*0 activates the source R4, i.e., a signal of the amplitude 8 is supplied to the second input of the discriminator D. If the amplitude of the analog signal falls within the upper half of the total amplitude range a binary 1 will then be obtained at the output of the discriminator, said one being supplied to the output U of the arrangement at the point of time when the clock pulse *k*1 appears. The analog signal shall in this case be compared with the amplitude value which represents the center of the upper half of the amplitude range, i.e., the amplitude 12, which means that besides the source R4 also the source R3 should be switched in. This is indicated by the arrow denoted 1 in the figure. If, however, the analog signal falls within the lower half of the amplitude range the next comparison shall be made with the center of this half, i.e., the amplitude value 4, which means that the source R3 should be switched in and the source R4 should be switched out. This is indicated by the arrow denoted 0 in the figure. In a corresponding way the following digits of the binary number, which represents the subrange within which the analog signal falls, is obtained during the clock pulses *k*2–*k*4 in accordance with the pattern shown in the figure. An analysis of the conditions for cutting in and cutting out the source gives the following rules: When the coding is started the source having the largest amplitude should be cut in, whereas the other sources should be cut out. During the following clock pulses a source is to be cut in only if the source having the next larger amplitude value is cut in and none of the sources having a smaller amplitudes is cut in. Cutting out should be made only if the output signal from the discriminator is zero and none of the sources having smaller amplitude values is cut in. Further, if the conditions for cutting in as well as for cutting out are satisfied the source should be cut in if it is cut out and cut out if it is cut in. Thus, the state of the signal sources and consequently the flip-flops together with the output signal of the discriminator gives unambiguous conditions concerning the sources to be cut in or cut out at each clock pulse and thus a shift register is not required.

Figure 3:
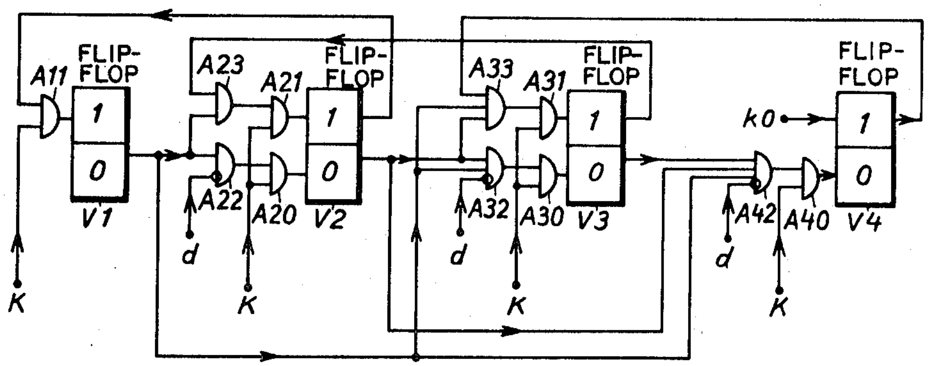

In FIG. 3 there is shown the interconnection according to the invention of the four flip-flops V1–V4 controlling the reference signal sources R1–R4 in FIG. 2, the interconnection being in accordance with the above-formulated rules. In the figure it is presumed that before the coding starts, all the flip-flops are set to zero by means of resetting pulses, the connections of which are not shown in the figure. When the coding starts the setting input of the flip-flop V4 is supplied with the clock pulse *k*0 (FIG. 2) from an input denoted *k*0, thus satisfying the above-mentioned initial condition. To the other flip-flop inputs, except the resetting input of the flip-flop V1, AND-circuits A11, A21, A20, A31, A30 and A40 are connected, one input of each of the AND-circuits being connected to the clock pulse generator. The pulses open the circuits at the points of time when the clock pulses *k*1, *k*2, *k*3 and *k*4 occur. The AND-circuit A11, which has its output connected to the setting input of the flip-flop V1, has its other input connected to that output of the flip-flop V2, which is cut in when the flip-flop is set. The circuits A21 and A31 have their second input connected to the output of two AND-circuits A23 and A33 respectively. These circuits have on input connected to the output of the flip-flops V3 and V4 respectively. Furthermore the circuit A23 has one input connected to the output of the flip-flop V1 which is activated when the flip-flop is reset and the circuit A33 has inputs connected to this output of the flip-flop V1 as well as to the corresponding output of the flip-flop V2. The circuits A11, A23 and A33 are thus connected in accordance with he above-formulated rule for cutting in the reference signal sources. In order to control the cutting out of the sources the circuits A20, A30 and A40 have their second input connected to the output of AND-circuits A22, A32 and A42 respectively which circuits have an inverting input connected to the output d of the discriminator D (FIG. 1) and also have inputs connected to the reset outputs of those flip-flops which control signal sources having smaller output signals. The condition for activating the resetting inputs of the respective flip-flops will thus be in accordance with the above-given rule concerning the cutting out of the reference signal sources. Thus the interconnection of the flip-flops shown in FIG. 3 makes it possible to control the signal sources so as to obtain the binary digits without requiring any shift register.

The above-described principle for interconnecting the flip-flops may of course also be used at the linear encoding in an encoder where this encoding is preceded by a nonlinear encoding which is generally the case in, for example, telephone systems using PCM technique.

I claim:

1. An analog to digital encoder having a control unit for controlling connections between *n* reference signal sources and an adding circuit depending on signals from a discriminator output which represent a binary 1 and a binary 0 respectively when at the discriminator inputs the amplitude of an analog signal is larger and smaller respectively than the amplitude of a signal from said adding circuit said reference signal sources, being characterized in that the source having the order number *m*, where $2 \leq m \leq n$, generates a signal having an amplitude twice as large as the signal from the source having the order number $(m-1)$, *m* and *n* being integers, said control unit comprising *n* bistable flip-flops each controlling one of said reference signal sources and each provided with a set and a reset input for setting to the first and the second stable state respectively, thereby activating the first and the second outputs of the flip-flop and closing and opening respectively, the connection between the adding circuit and the reference signal source controlled by the flip-flop, a clock pulse generator, means activated by a zero-pulse from said clock pulse generator, for setting the flip-flop corresponding to the *n*'th reference signal source to said first stable state and the other flip-flops to said second stable state, a first plurality of AND-circuits, each having an output connected to one of the set inputs of the flip-flops, except the flip-flop corresponding to the *n*'th source, and a first input connected to the first output of the flip-flop corresponding to the reference source generating a signal having an amplitude twice as large as the signal from the reference signal source to which the first AND-circuit corresponds, and a second plurality of AND-circuits, each having an output connected to one of the reset inputs of the flip-flops except the flip-flop corresponding to the first reference signal, and each having a first inverting input connected to said discriminator output, each AND-circuit of said first and said second pluralities having a second input activated by *n* pulses following said zero-pulse from said clock-pulse generator means, and the AND-circuits of the first and second pluralities corresponding to the *m*'th source having $(m-1)$ additional inputs each connected to one of the second flip-flop outputs corresponding to a reference signal source generating a lower signal amplitude than the reference signal source to which the respective AND-circuits correspond.

* * * * *